US010446420B2

(12) United States Patent
Oki et al.

(10) Patent No.: US 10,446,420 B2
(45) Date of Patent: Oct. 15, 2019

(54) UPPER CONE FOR EPITAXY CHAMBER

(71) Applicant: Applied Materials, Inc., Santa Clara, CA (US)

(72) Inventors: Shinichi Oki, Chiba-Ken (JP); Yoshinobu Mori, Ohmura (JP); Yuji Aoki, Yokohama (JP)

(73) Assignee: Applied Materials, Inc., Santa Clara, CA (US)

( * ) Notice: Subject to any disclaimer, the term of this patent is extended or adjusted under 35 U.S.C. 154(b) by 300 days.

(21) Appl. No.: 15/637,930

(22) Filed: Jun. 29, 2017

(65) Prior Publication Data

US 2018/0053670 A1 Feb. 22, 2018

Related U.S. Application Data

(60) Provisional application No. 62/393,942, filed on Sep. 13, 2016, provisional application No. 62/380,114, (Continued)

(51) Int. Cl.
*H01L 21/67* (2006.01)
*C23C 16/48* (2006.01)
(Continued)

(52) U.S. Cl.
CPC .... *H01L 21/67248* (2013.01); *C23C 16/4401* (2013.01); *C23C 16/4411* (2013.01);
(Continued)

(58) Field of Classification Search
CPC ... H01L 21/67248; H01L 21/20; C30B 25/14; C23C 16/4411; C23C 16/466;
(Continued)

(56) References Cited

U.S. PATENT DOCUMENTS 4,920,918 A * 5/1990 Adams .................... C23C 16/44
118/715
5,085,887 A * 2/1992 Adams .................. C23C 16/481
118/620
(Continued)

FOREIGN PATENT DOCUMENTS

JP 2000-331939 A 11/2000
JP 2005-517295 A 2/2003
(Continued)

OTHER PUBLICATIONS

International Search Report and Written Opinion dated Jul. 25, 2014 for PCT/US2014/026589.
(Continued)

*Primary Examiner* — Rudy Zervigon
(74) *Attorney, Agent, or Firm* — Patterson + Sheridan, LLP

(57) ABSTRACT

An epitaxial deposition chamber having an upper cone for controlling air flow above a dome in the chamber, such as a high growth rate epitaxy chamber, is described herein. The upper cone has first and second components separated by two or more gaps in the chamber, each component having a partial cylindrical region having a first concave inner surface, a first convex outer surface, and a fixed radius of curvature of the first concave inner surface, and a partial conical region extending from the partial cylindrical region, the partial conical region having a second concave inner surface, a second convex outer surface, and a varying radius of curvature of the second concave inner surface, wherein the second concave inner surface extends from the partial cylindrical region to a second radius of curvature less than the fixed radius of curvature.

10 Claims, 2 Drawing Sheets

Related U.S. Application Data filed on Aug. 26, 2016, provisional application No. 62/495,575, filed on Aug. 19, 2016.

(51) Int. Cl.

| | | |
|---|---|---|
| *H01L 21/20* | (2006.01) | |
| *C23C 16/44* | (2006.01) | |
| *C23C 16/46* | (2006.01) | |
| *C30B 25/14* | (2006.01) | |
| *C23C 16/455* | (2006.01) | |
| *C23C 16/52* | (2006.01) | |

(52) U.S. Cl.
CPC .......... *C23C 16/466* (2013.01); *C23C 16/481* (2013.01); *C30B 25/14* (2013.01); *H01L 21/20* (2013.01); *C23C 16/4405* (2013.01); *C23C 16/455* (2013.01); *C23C 16/52* (2013.01)

(58) Field of Classification Search
CPC . C23C 16/4401; C23C 16/481; C23C 16/455; C23C 16/52; C23C 16/4405
USPC ...................................... 118/715; 156/345.33
See application file for complete search history.

(56) References Cited

U.S. PATENT DOCUMENTS

| | | | | |
|---|---|---|---|---|
| 5,226,732 A * | 7/1993 | Nakos | ................... | G01J 5/0003 250/338.1 |
| 5,304,248 A | 4/1994 | Cheng et al. | | |
| 5,518,593 A | 5/1996 | Hosokawa et al. | | |
| 5,573,566 A * | 11/1996 | Anderberg | .......... | C03B 23/0256 425/110 |
| 5,576,059 A * | 11/1996 | Beinglass | .......... | C23C 16/45591 427/255.18 |
| 5,683,518 A * | 11/1997 | Moore | ................ | C23C 16/4404 118/50.1 |
| 5,725,673 A * | 3/1998 | Anderson | ............. | C23C 16/455 118/715 |
| 5,932,286 A * | 8/1999 | Beinglass | ............. | C23C 16/345 427/255.11 |
| 5,960,158 A * | 9/1999 | Gat | ........................... | G01J 5/06 219/390 |
| 6,031,211 A * | 2/2000 | Mailho | ................... | C23C 16/46 219/121.4 |
| 6,093,252 A * | 7/2000 | Wengert | ................... | B01J 3/006 118/715 |
| 6,099,648 A * | 8/2000 | Anderson | ............... | C30B 25/08 118/715 |
| 6,111,225 A | 8/2000 | Ohkase et al. | | |
| 6,113,703 A * | 9/2000 | Anderson | ............. | C23C 16/455 118/724 |
| 6,143,079 A * | 11/2000 | Halpin | ................ | C23C 16/4584 118/620 |
| 6,169,244 B1* | 1/2001 | Carlos | ...................... | G01K 1/08 118/715 |
| 6,281,141 B1* | 8/2001 | Das | ..................... | H01L 21/0214 257/E21.268 |
| 6,383,330 B1* | 5/2002 | Raaijmakers | ........... | C23C 16/44 118/715 |
| 6,406,543 B1* | 6/2002 | Anderson | ............. | C23C 16/481 118/715 |
| 6,437,290 B1* | 8/2002 | Shao | ..................... | C23C 16/481 118/724 |
| 6,879,777 B2* | 4/2005 | Goodman | ......... | H01L 21/67115 118/724 |
| 7,169,233 B2* | 1/2007 | Wood | ...................... | C23C 16/44 118/715 |
| 7,381,275 B2* | 6/2008 | Miyano | ............. | C23C 16/45563 118/641 |
| 7,785,419 B2* | 8/2010 | Tateishi | ............... | C23C 16/4585 118/50 |
| 8,075,690 B2* | 12/2011 | Keller | .................. | H01J 37/3244 118/715 |
| 9,845,550 B2* | 12/2017 | Brillhart | .................. | C30B 25/14 |
| 9,856,580 B2* | 1/2018 | Sanchez | ................... | C30B 29/06 |
| 9,870,919 B2* | 1/2018 | Ranish | ................ | H01L 21/0262 |
| 2002/0185062 A1 | 12/2002 | Halpin | | |
| 2003/0077388 A1* | 4/2003 | Byun | ...................... | B82Y 10/00 427/255.28 |
| 2003/0150560 A1 | 8/2003 | Kinnard et al. | | |
| 2003/0178145 A1 | 9/2003 | Anderson et al. | | |
| 2004/0241992 A1 | 12/2004 | Kono et al. | | |
| 2006/0249695 A1 | 11/2006 | Choi | | |
| 2007/0107653 A1 | 5/2007 | Yamada | | |
| 2007/0281084 A1 | 12/2007 | Hirosawa et al. | | |
| 2008/0178801 A1 | 7/2008 | Pavloff et al. | | |
| 2010/0112213 A1* | 5/2010 | Nakamura | .......... | C23C 16/4586 427/248.1 |
| 2010/0112744 A1* | 5/2010 | Molnar | ...................... | B01J 8/18 438/57 |
| 2014/0190822 A1 | 7/2014 | Riker et al. | | |
| 2015/0152545 A1* | 6/2015 | Goujard | ................ | C23C 16/045 118/715 |
| 2015/0233016 A1* | 8/2015 | Brillhart | ................. | C30B 25/14 118/724 |
| 2015/0345023 A1* | 12/2015 | Ranish | ............. | H01L 21/67109 118/725 |
| 2016/0033070 A1* | 2/2016 | Brillhart | ............. | C23C 16/4412 137/565.01 |
| 2018/0053670 A1* | 2/2018 | Oki | ......... | H01L 21/20 |
| 2019/0067006 A1* | 2/2019 | Hawrylchak | ..... | H01L 21/02658 |
| 2019/0110336 A1* | 4/2019 | Cong | .................. | H05B 3/0047 |

FOREIGN PATENT DOCUMENTS

| | | |
|---|---|---|
| JP | 2003-197719 A | 7/2003 |
| JP | 2003197532 A | 7/2003 |
| JP | 2005-183510 A | 12/2003 |
| JP | 2004-134625 A | 4/2004 |
| JP | 2004-200603 A | 7/2004 |
| JP | 2005-197380 A | 7/2005 |
| JP | 2005260095 A | 9/2005 |
| JP | 2006-049503 A | 2/2006 |
| JP | 2007-294492 A | 11/2007 |
| JP | 2007324285 A | 12/2007 |
| JP | 2008235830 A | 10/2008 |
| JP | 2010147350 A | 7/2010 |
| JP | 2012-054567 A | 9/2011 |
| JP | 2012222301 A | 11/2012 |
| TW | 200809926 A | 2/2008 |
| TW | 201305373 A | 2/2013 |
| WO | 2013016266 A1 | 1/2013 |

OTHER PUBLICATIONS

International Search Report and Written Opinion dated Jul. 22, 2014 for PCT/US2014/026616.
Office Action from Japanese Patent Application Serial No. 2013-240740 dated Jan. 13, 2017.
Office Action from Chinese Patent Application No. 201480013791 dated Apr. 13, 2017.

\* cited by examiner

UPPER CONE FOR EPITAXY CHAMBER

CROSS-REFERENCE TO RELATED APPLICATIONS

This application claims benefit to Provisional Patent Application Ser. No. 62/380,114, filed on Aug. 26, 2016; Provisional Patent Application Ser. No. 62/393,942 filed on Sep. 13, 2016; and Provisional Patent Application Ser. No. 62/495,575 filed on Aug. 18, 2016, which are all incorporated by reference herein.

BACKGROUND

Field of the Invention

The present disclosure generally relates to an apparatus for semiconductor processing. More specifically, the present disclosure relates to apparatus for controlling air flow in an epitaxy chamber.

Description of the Related Art

Epitaxy is a process commonly used in semiconductor processing to fabricate high quality materials with uniform electrical properties for semiconductor devices. In a typical epitaxy chamber, process gasses flow across a substrate in a direction parallel to the substrate to form a film on the substrate. The process gasses typically flow from one side of the chamber to the other side, where exhaust gases are removed.

A prior implementation of a cone 30 for controlling air flow to control deposition on an upper dome of an epitaxy chamber is shown in FIG. 1 (Prior Art) for comparison to FIG. 2 below. The cone 30 shown in FIG. 1 has a cylindrical shaped portion and a tapered lower portion 31. The lower portion is tapered to control air flow and produce a more uniform substrate temperature. A single slit 32 extends from a top of the cone 30 to a bottom of the cone 30. When placed in an epitaxy chamber, the cone 30 is positioned above an upper dome and the single slit 32 of the cone 30 is placed beneath a pyrometer to allow passage of infrared waves through the single slit 32 of the cone 30.

The arrows in FIG. 1 illustrate air flow through the cone 30 when the air enters the top of the cone 30. Air travels down through the cone 30 and exits to the bottom of the cone 30, while some of the air introduced into the cone 30 exits to the side of the cone 30 through the single slit 32.

Deposits formed on an upper dome when using the cone 30 impact the performance of the chamber during processing. For example, any coating on the upper dome may block light irradiation from reaching a portion of the substrate during processing, compromising the uniformity of the film formed on the substrate. Coatings on the upper dome can also cause slip dislocations across the surface of the substrate. Coatings may form on the upper dome if the upper dome has non-uniform temperatures during processing. The coatings often form in areas of extreme high and low temperatures on the upper dome at the exhaust side of the chamber.

Thus, a need exists for techniques to reduce or eliminate coatings formed on the upper dome above the substrate during processing in a high growth rate epitaxy chamber.

SUMMARY

A multi-slit upper cone 70 for use in an epitaxy chamber, such as a high growth rate epitaxy processing chamber 100, is shown in FIG. 2 and described herein. In one implementation, the multi-slit upper cone 70 has a body component 46 having a partial cylindrical region having a first concave inner surface 51 having an edge 49 with a length L1 and a first convex outer surface 52, and a partial conical region 58 that tapers to an edge 53 having a length L2 less than the length L1.

In another implementation shown by the cross-section in FIG. 3, the multi-slit upper cone 70 comprises an annular plate 177 supporting first and second body components 45, 46 of the multi-slit upper cone 70 while maintaining two slits 71 which may have equal width W (see FIG. 2; only one slit is shown in the section view of FIG. 3).

In a further implementation, an epitaxial growth processing chamber 100 having improved air flow through the multi-slit upper cone 70 includes a susceptor 103 centered below the multi-slit upper cone 70 and positioned between an inlet port 154 and an outlet port 157 for process gases. An upper dome 121 separates any process gases below the upper dome 121 from air circulating through the multi-slit upper cone 70 above the upper dome 121.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

DETAILED DESCRIPTION

Figure 1:
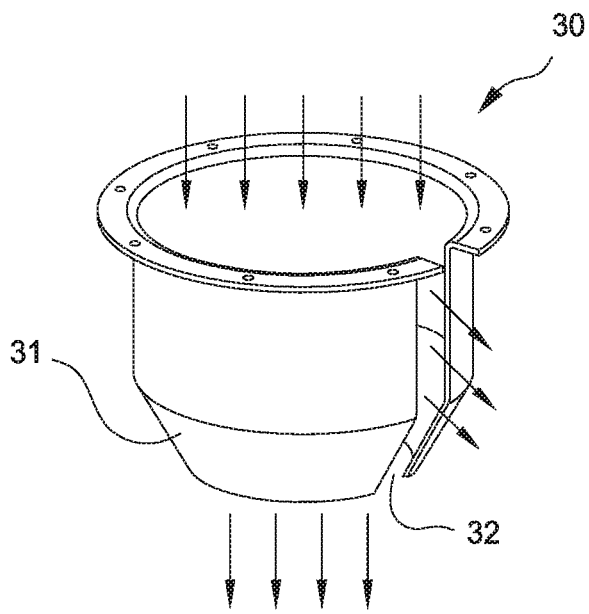
FIG. 1 (Prior Art) is a perspective view of a cone 30 according to a prior implementation.
Figure 2:
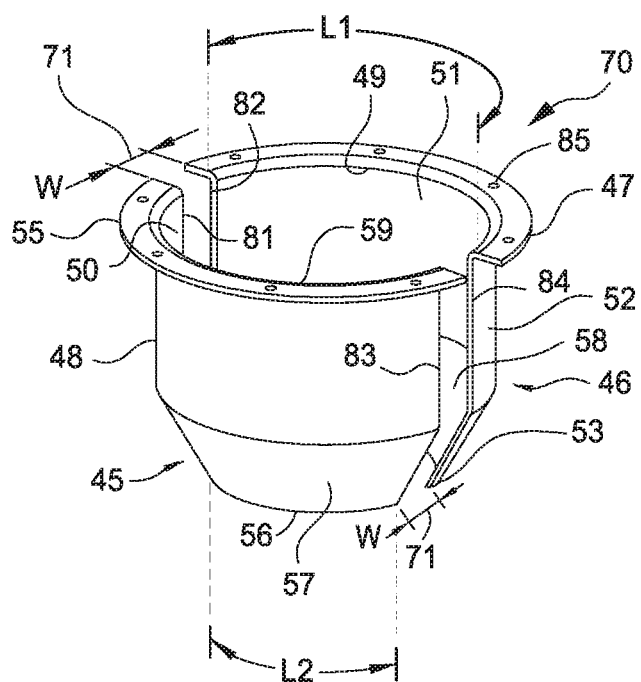
FIG. 2 is a perspective view of a multi-slit upper cone 70 of the present disclosure, according to one implementation.
Figure 3:
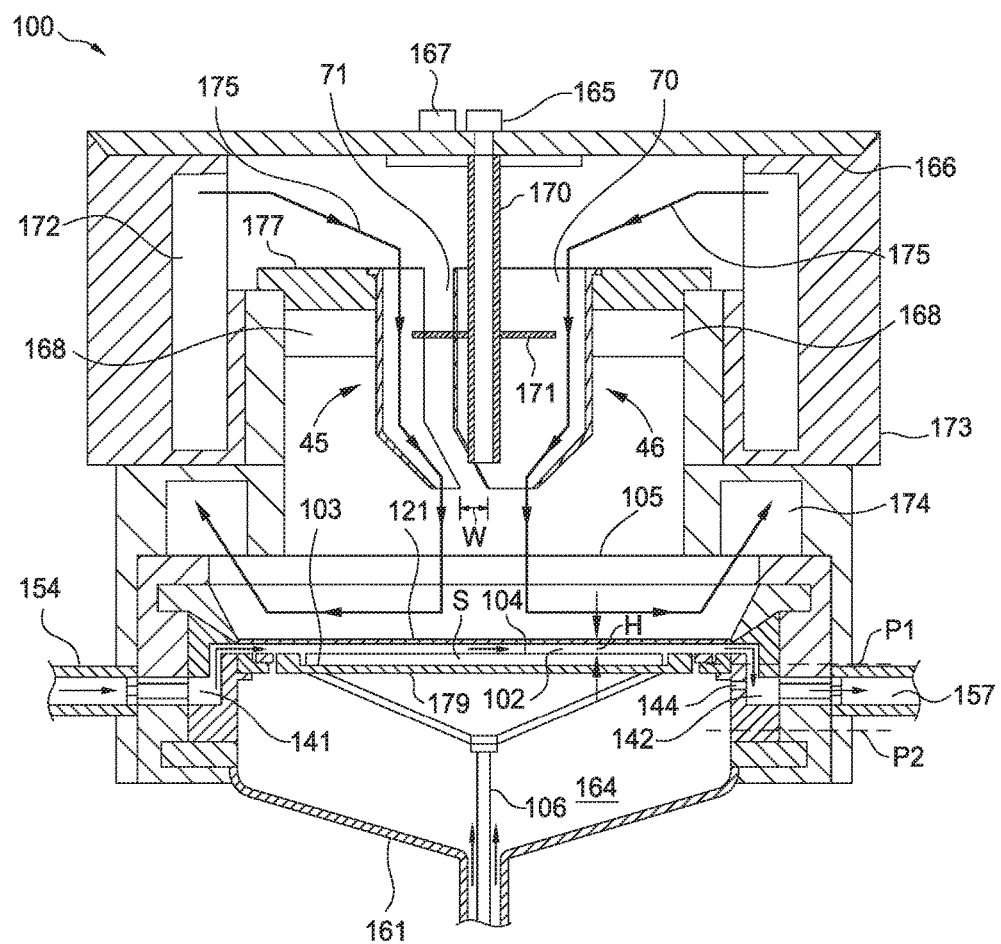
FIG. 3 is a schematic cross-sectional view of an epitaxy processing chamber 100 having a multi-slit upper cone 70, according to one implementation.

FIG. 2 illustrates a multi-slit upper cone 70 of the present disclosure, according to one implementation. The multi-slit upper cone 70 is shaped similar to the cone 30 of FIG. 1, however the multi-slit upper cone 70 has more than one slit 71, thus the multi-slit upper cone 70 includes at least a first body component 45 and a second body component 46. The body components 45 and 46 are positioned in FIG. 2 according to how the body components would be positioned within an epitaxy processing chamber 100 as shown in FIG. 3, according to one implementation. However, the present disclosure is not limited to this implementation, and the multi-slit upper cone 70 may have more than two slits 71, providing more than two body components, and the body components may be non-cylindrical.

Each body component 45, 46 of the multi-slit upper cone 70 of FIG. 2 has a partial cylindrical region having a concave inner surface 50, 51 and a convex outer surface 48, 52. Each surface 50, 51, 48, 52 abuts a partial conical region 57, 58 tapering inward toward the first or second bottom edges 56, 53. Because of this taper, for each of the body components 45, 46 shown in FIG. 2, the radius and length L2 of the bottom edges 56, 53 are smaller than the radius and length L1 of the top edges 59, 49. For example, in one implementation, the length L1 of each top edge 59, 49 is twice the length L2 of each bottom edge 56, 53.

In the implementation shown in FIG. 2, the radius and length L1 of the top edge 59 of the first body component 45 is the same as the radius and length L1 of the top edge 49 of the second body component 46. The radius and length L2 of the bottom edge 56 of the first body component 45 is the same as the radius and length L2 of the bottom edge 53 of the second body component 46 in one implementation. Further, in the implementation shown in FIG. 2, all slits 71 can have the same width W, with the width W being consistent along the length of the slit. However, the present disclosure does not exclude additional body components and additional slits.

In the implementation shown in FIG. 2, the first body component 45 has a first side end 81 and a second side end 83 and the second body component 46 has a first side end 82 and a second side end 84. The first side end 81 of the first body component 45 is spaced from the first side end 82 of the second body component 46 by the width W of the slit 71 forming a gap between the first side end 81 of first body component 45 and the first side end 82 of the second body component 46. Additionally, the second side end 83 of the first body component 45 is spaced from the second side end 84 of the second body component 46 by the width W of the slit 71 forming a gap between the second side end 83 of the first body component 45 and the second side end 84 of body component 46. In one implementation, the width W of the slits 71 is from 20 mm to 25 mm. However, the width W of one or more slits 71 may be selected based on the width necessary for the passage of infrared waves between the upper dome 121 and the pyrometer 167 in processing chamber 100 as shown in FIG. 3, and/or the width W of one more slits 71 may be selected to influence the temperature of upper dome 121 as discussed herein with reference to FIG. 3.

Body components 45, 46 of the multi-slit upper cone 70 may have a lip 55, 47. Each lip 55, 47 allows for each body component 45, 46 to be supported by the annular plate 177 located within the chamber body 173 of the epitaxy processing chamber 100 as shown in FIG. 3. As further shown in FIG. 2, each lip 55, 47 may have holes 85 such that each body component 45, 46 can be fastened to the annular plate 177 within the epitaxy processing chamber 100. However, the present disclosure is not limited to the implementation shown in FIG. 2, and the cone may be secured to an epitaxy processing chamber 100 by other means of attachment.

FIG. 3 is a schematic cross-sectional view of an epitaxy processing chamber 100 according to one implementation. The epitaxy processing chamber 100 has a reaction chamber 102 below a transparent upper dome 121 in the chamber body 173. An epitaxial film grows on a substrate S during processing within the reaction chamber 102. The reaction chamber 102 includes a susceptor 103 on which the substrate S is mounted. The annular plate 177 supports internal components above the upper dome 121. The implementation shown in FIG. 3 is a high growth rate epitaxy processing chamber in which the distance H between substrate S and the upper dome 121 may be 10 mm or more.

The susceptor 103 is a plate-like member having a circular shape when viewed from the upper side, and has a slightly larger area than the substrate S. The susceptor 103 may be porous or non-porous and is supported by a susceptor support 106. The susceptor 103 may have one or more holes 179 therein to assist in controlling temperature of hotspots on the susceptor 103. In another implementation, the susceptor 103 may have no holes therein. The susceptor 103 moves from the film-forming position P1, at which a film is formed on the substrate S, to a substrate-carrying position P2, at which the substrate S is transferred in and out of epitaxy processing chamber 100. The susceptor support 106 may be configured to rotate, such that the susceptor 103 and the substrate S rotate about the axis of the susceptor support 106 while at the film-forming position P1.

The processing chamber 100 according to this implementation is a cold wall type epitaxial growth processing chamber. The upper dome 121 is configured to heat the inside of reaction chamber 102 by receiving heat from lamps 168 located above the upper dome 121. The multi-slit upper cone 70 is located above the upper dome 121 and between a plurality of lamps 168. In one implementation, the upper dome 121 may be made of quartz. In one implementation, the multi-slit upper cone 70 may be comprised of aluminum and may further comprise a gold plated surface.

During substrate processing, reactant gas is introduced through an inlet port 154 in the chamber body 173. In this implementation, a first source gas and a second source gas are introduced through the inlet port 154. The second source gas also serves as a carrier gas. A mixture of three or more types of gases may be used as the reactant gas. When the reactant gas is introduced through the inlet port 154, the reactant gas flows along a reactant gas supply path 141, flows over the upper surface 104 of substrate S in the horizontal direction, and then flows along gas discharge path 142 until it exits the epitaxy processing chamber 100 at an outlet port 157. The gas inlet port 154 faces the gas outlet port 157 in the epitaxy processing chamber 100 with a center of the reaction chamber 102 located therebetween.

Purge gas is introduced through the center of an epitaxy chamber bottom portion 161 into a lower chamber 164. Purge gas exits lower chamber 164 through a purge hole 144 formed in the chamber body 173. The purge hole 144 communicates with the gas discharge path 142, and therefore, both the reactant gas and the purge gas are discharged through the gas discharge path 142.

A top plate 166 at the top of the epitaxy processing chamber 100 holds at least two pyrometers 165, 167. A first pyrometer 165 measures the temperature of substrate S through a hollow tube 170, and is located above the center of the multi-slit upper cone 70. A second pyrometer 167 measures the temperature of the upper dome 121. The second pyrometer 167 is located above one slit 71 in the multi-slit upper cone 70, such that infrared waves can pass from the upper dome 121, through the slit 71 in the multi-slit upper cone 70, up to pyrometer 167.

An air source (not shown) introduces cool air through first openings 172 in the chamber body 173. The air is directed through the chamber body 173 such that the air travels along an air path 175 as shown in FIG. 3. The air enters the top of the multi-slit upper cone 70, travels downward through the multi-slit upper cone 70, exits the multi-slit upper cone 70 travelling down through a central opening 105, and then travels horizontally below the central opening 105, and above the upper dome 121 located above the upper surface 104 of the substrate S. The air then exits the chamber body 173 through second openings 174.

Air flow through the multi-slit upper cone 70 is further controlled by an obstruction plate 171 within the multi-slit upper cone 70. The obstruction plate 171 is supported by the hollow tube 170 suspended from the top plate 166 within the center of the multi-slit upper cone 70. The obstruction plate 171 disrupts the air flow through the multi-slit upper cone 70 along air path 175 and directs the air around obstruction plate 171 forcing the air along the inner walls of multi-slit upper cone 70 and also forcing additional air out through the width W of slits 71. By increasing or decreasing the width W of slits 71 will further control the amount of air passing through the gaps provided by the width W of slits 71 and also along air path 175 out past the bottom edges 56, 53 of multi-slit upper cone 70.

A film forming method using the epitaxial growth apparatus according to this implementation of epitaxy processing chamber 100 is described below.

First, the susceptor 103 is moved to the substrate-carrying position P2, a substrate S is transferred into the epitaxy processing chamber 100 from a substrate carrying port in chamber body 173, and the susceptor 103 is moved to the film-forming position P1. For example, in one implementation, a silicon substrate with a diameter of 200 mm is used as the substrate S. Then, the substrate S is heated from the standby temperature (for example, 800° C.) to the growth temperature (for example, 1100° C.). The purge gas (for example, hydrogen) is introduced into the lower chamber 164. The reactant gas (for example, trichlorosilane as the first source gas and hydrogen as the second source gas) is introduced into the reaction chamber 102 along the reactant gas supply path 141 from the reactant gas inlet port 154. The reactant gas forms a boundary layer on the upper surface 104 of the substrate S and a reaction occurs in the boundary layer. Accordingly, a silicon film is formed on the substrate S. The reactant gas is discharged along the gas discharge path 142 communicating with the reaction chamber 102. The purge gas is discharged to the gas discharge path 142 through the purge hole 144. After the epitaxial growth is complete, the temperature is reduced to the standby temperature and the substrate S is transferred out of the epitaxy processing chamber 100.

In one implementation, when the multi-slit upper cone 70 is placed as shown in FIG. 2 within an epitaxy processing chamber 100 as shown in FIG. 3, the body components 45, 46 are laterally spaced about a vertical axis through the center of the opening 105, which also runs through the center of the upper dome 121 and the center of the substrate S during processing in the epitaxy processing chamber 100. In this implementation, the slits 71 are spaced 180 degrees apart.

When cooling air blows through the epitaxy processing chamber 100 during processing along the air path 175 shown in FIG. 3, less cooling air will reach the upper surface 104 of upper dome 121 located directly below the slits 71 compared to the rest of the surface of upper dome 121 because at least some of the air flowing into the top of the multi-slit upper cone 70 near the slits 71 will exit the side of the multi-slit upper cone 70, rather than flowing down onto the upper dome 121 beneath the multi-slit upper cone 70. As such, placing at least one of the slits 71 above an area of the upper surface 104 of upper dome 121 known to be a low temperature area during processing will result in less cool air flowing down onto this low temperature area, thus increasing the temperature of the low temperature area.

Further, by increasing the velocity of the cool air flow along air path 175, along with strategically placing the one or more slits 71 above one or more low temperature areas on the upper dome 121, the increased velocity of the cool air will result in an increased velocity/magnitude of the cool air blown directly onto one or more high temperature areas of upper dome 121 (not located beneath the gaps provided by slits 71), thus reducing the temperature of the high temperature area(s). This reduction in the temperature of the high temperature area(s) will occur without also reducing the temperature of the one or more low temperature area(s), because cool air blowing into the multi-slit upper cone 70 above the low temperature area(s) will escape to the side of the cone 70 through the gaps provided by slit 71 located above the low temperature area(s), resulting in a decreased velocity/magnitude of the cool air blown directly onto the low temperature area(s), which will increase the temperature of the low temperature area(s). Thus, by placing one or more slits 71 above one or more low temperature area(s) of upper dome 121, and by increasing the velocity of the cool air flow along air path 175 in the epitaxy processing chamber 100, the temperature of the low temperature area(s) will increase during processing, the temperature of the high temperature area(s) will decrease during processing, and the temperature across the surface of the upper dome 121 will become more uniform. Low temperature areas of the upper dome 121 under slits 71 may alternatively be controlled by increasing or decreasing the width W of slits 71 and allowing either more or less cool air to be blown directly on the low temperature area(s).

For example, in one implementation, the temperature below the upper dome 121 should be controlled from 485 to 515 degrees Celsius to prevent deposition from occurring at the exhaust end of the upper dome 121. As such, a low temperature area (below 485 degrees Celsius) on the exhaust end of the upper dome 121, and high temperature (above 515 degrees Celsius) on the exhaust end of the upper dome 121 would be at risk for deposition. The multi-slit upper cone 70 could be strategically placed such that a slit 71 is placed above a low temperature area at the exhaust end of the upper dome 121. The multi-slit upper cone 70 could also be strategically placed such that no slit 71 is placed above a high temperature area at the exhaust end of the upper dome 121. The cool air flow velocity can then be increased above a traditional air flow velocity. For example, in one implementation, the traditional air flow velocity applied during processing using the cone 30 of the prior art is in the range of 9 m/s to 12 m/s, and the air flow velocity is increased to a range of 13 m/s to 14.5 m/s when using the multi-slit upper cone 70 described herein. The placement of the slit 71 will cause the temperature of the low temperature area on upper dome 121 to increase. The increase of the cool air flow velocity will cause the temperature of the high temperature area on upper dome 121 to decrease. As such, the likelihood that deposition will occur on the high temperature area and on the low temperature area is reduced.

While the foregoing is directed to implementations of the present disclosure, other and further implementations of the disclosure may be devised without departing from the basic scope thereof, and the scope thereof is determined by the claims that follow.

What is claimed is:

1. A processing chamber, comprising:
   a susceptor positioned between a gas introduction port located on a first side of the processing chamber and an gas exhaust port located on a second side of the processing chamber;
   a dome in the processing chamber above the susceptor; and
   a plate in the processing chamber above the dome, the plate having a central opening and supporting at least two components separated laterally within the central opening by two or more gaps, each component having:
      an upper region having a concave inner surface and a convex outer surface; and
      a lower region tapering inward from the upper region.

2. The processing chamber of claim 1, wherein the upper region of each component has a fixed radius of curvature, and the lower region of each component has a varying radius of curvature.

3. The processing chamber of claim 1, wherein the upper region of each component has a lip contacting the plate.

4. The processing chamber of claim 1, further comprising a chamber lid supporting two pyrometers above the central opening in the plate.

5. The processing chamber of claim 4, wherein at least one pyrometer is positioned on the chamber lid above at least one of the two or more gaps.

6. The processing chamber of claim 1, wherein the plate in the processing chamber is an annular plate and each component has:
   a partial cylindrical region having a first concave inner surface, a first convex outer surface, and a fixed radius of curvature of the first concave inner surface; and
   a partial conical region having a second concave inner surface, a second convex outer surface, and a varying radius of curvature of the second concave inner surface, wherein the second concave inner surface extends from the partial cylindrical region to a second radius of curvature less than the fixed radius of curvature.

7. The processing chamber of claim 6, wherein the partial cylindrical region of the first component has a lip contacting the annular plate and the partial cylindrical region of the second component has a lip contacting the annular plate.

8. The processing chamber of claim 6, further comprising a chamber lid supporting two pyrometers above the central opening in the annular plate.

9. The processing chamber of claim 8, wherein at least one pyrometer is positioned on the chamber lid above at least one of the two or more gaps.

10. The processing chamber of claim 1, comprising a lamps below the plate.

* * * * *

UNITED STATES PATENT AND TRADEMARK OFFICE
CERTIFICATE OF CORRECTION

PATENT NO. : 10,446,420 B2  
APPLICATION NO. : 15/637930  
DATED : October 15, 2019  
INVENTOR(S) : Shinichi Oki et al.

Page 1 of 1

It is certified that error appears in the above-identified patent and that said Letters Patent is hereby corrected as shown below:

In the Specification

In Column 1, Line 10, delete "Aug. 18," and insert -- Aug. 19, --, therefor.

Signed and Sealed this  
Twenty-fourth Day of December, 2019

Andrei Iancu  
*Director of the United States Patent and Trademark Office*